United States Patent [19]

Nossen et al.

[11] Patent Number: 4,477,918
[45] Date of Patent: Oct. 16, 1984

[54] MULTIPLE SYNCHRONOUS COUNTERS WITH RIPPLE READ

[75] Inventors: Steve J. Nossen, Somerset, N.J.; Stanley S. Brokl, Altdena; Kenyon E. B. McGuire, San Diego, both of Calif.

[73] Assignee: RCA Corporation, New York, N.Y.

[21] Appl. No.: 310,854

[22] Filed: Oct. 13, 1981

[51] Int. Cl.³ .................... H03K 21/34; H03K 21/16
[52] U.S. Cl. ........................................ 377/37; 377/44
[58] Field of Search ................... 377/37, 46, 54, 129, 377/67, 44

[56] References Cited

U.S. PATENT DOCUMENTS

| | | | |
|---|---|---|---|
| 3,146,345 | 8/1964 | Conover, Jr. | 377/129 |
| 3,673,390 | 6/1972 | Krebs | 377/37 |
| 3,778,778 | 12/1973 | Ragen | 364/200 |
| 3,820,082 | 6/1974 | Bauknecht et al. | 364/200 |
| 4,396,829 | 8/1983 | Sugihara et al. | 377/37 |

Primary Examiner—John S. Heyman

Attorney, Agent, or Firm—J. S. Tripoli; R. L. Troike; D. W. Phillion

[57] ABSTRACT

A system for reading out the contents of multiple counters onto a common bus comprising a plurality of synchronous binary counters arranged in a ring with each counter having N corresponding stages each having an output terminal on which appears the contents of the stage, an input terminal, and a clock pulse input terminal, with each stage responsive to a clock pulse supplied to its clock input terminal to transfer the signal logic level on its input terminal to its output terminal and with the output terminals of the stages of a given counter comprising the common bus. Also provided is a clock pulse source for supplying clock pulses to all of the clock input terminals and a switching signal source for generating a switching pulse. A switch associated with each stage is responsive to the switching pulse to connect the output terminal of each stage to the input terminal of the corresponding stage of the next adjacent counter in the ring of counters.

4 Claims, 3 Drawing Figures

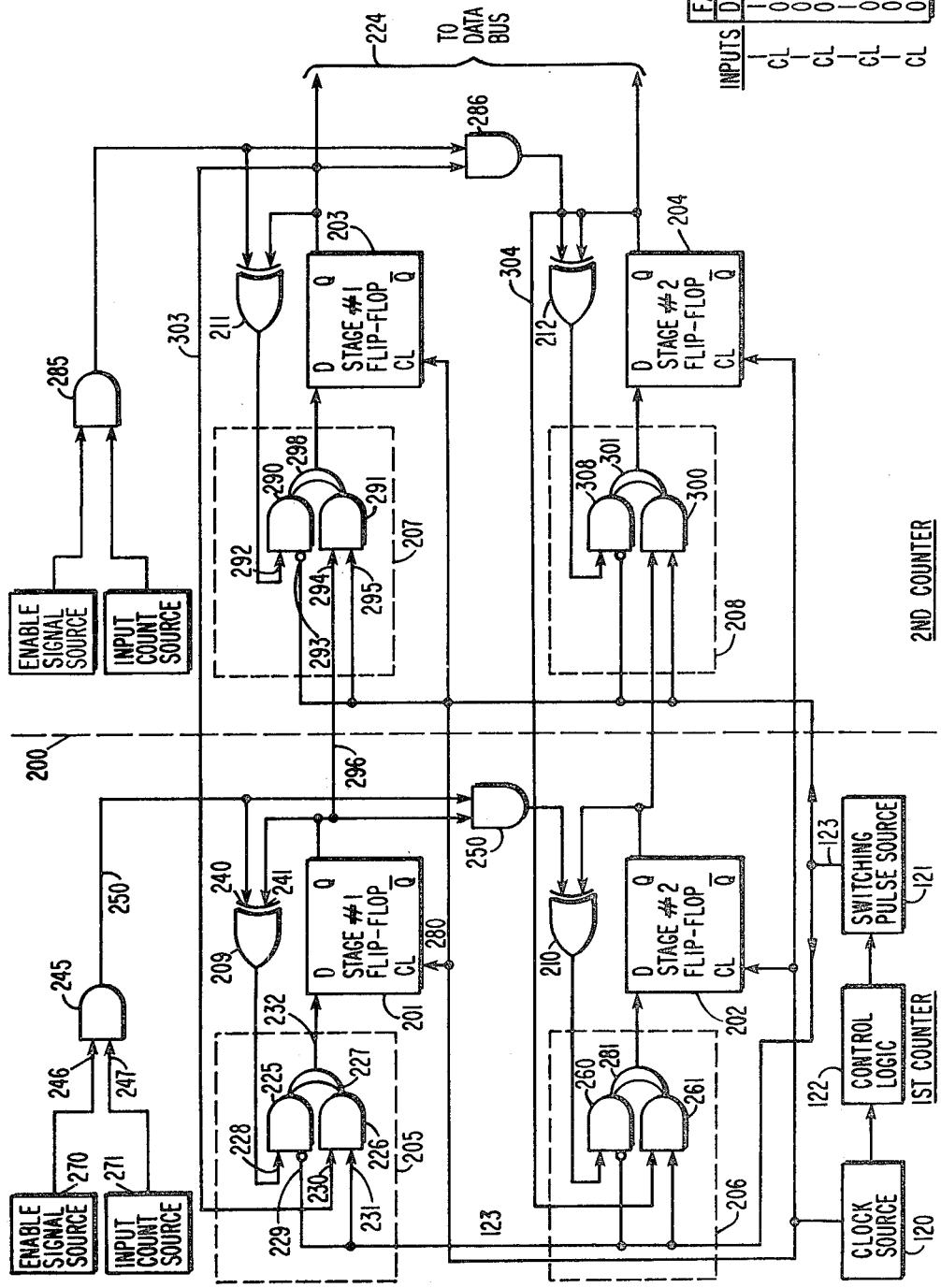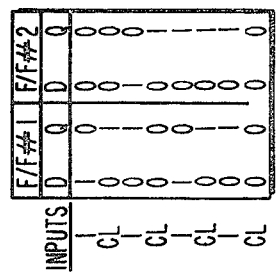

MULTIPLE SYNCHRONOUS COUNTERS WITH RIPPLE READ

This invention relates to an improved structure for reading the contents of a large number of independent counters onto a single bus so their contents can be utilized in some desired manner.

There are many applications where a large number of counters are required. For example, it might be desired to count the number of occurrences of a number of different events in an industrial process or, in the data processing system, the recording or counting of the number of different types of data received. At periodic intervals, it is often desirable to know the cumulative count in each counter. In prior art systems the reading of the counts contained in a plurality of counters is usually done by a multiplexing arrangement wherein the counts of each counter is, in turn, supplied to a common bus which leads to some suitable utilization device such as a computer. One means of multiplexing the contents of the counters onto a common bus is with the use of tri-state devices with each stage of each counter being connected to a line of the common bus by means of an individual tri-state device. The tri-state devices of each counter are then successively energized to supply the contents of the counter onto the bus.

The use of tri-state devices in the multiplexing scheme described above not only requires a large number of such tri-state devices but also results in a larger final package and, in some cases, the introduction of noise onto the data bus line due to the switching on and off of the tri-state devices.

The present invention provides a means for reading the contents of the counters onto a common bus without the need for multiplexing or switching devices such as tri-state devices.

In a preferred form of the present invention a plurality of synchronous binary counters are arranged in a ring, with each counter having N corresponding stages, each stage having an output terminal on which appears the contents of such stage, an input terminal, and a clock pulse input terminal and further with each stage responsive to a clock pulse supplied to its clock input terminal to transfer the signal logic level on its input terminal to its output terminal, and with the output terminals of the stages of a predetermined counter comprising the common bus. A signal generator functions to generate and supply clock pulses to all of the clock input terminals of the counter stages and also to generate a switching pulse. Also provided is a switch responsive to a switching pulse to connect the output terminal of each stage of each counter to the input terminal of the corresponding stage of the next adjacent counter in the ring of counters. Clock pulses occurring during the switching pulses will then function to supply the contents appearing on the output terminal of each stage to the input terminal of the corresponding stage of the next adjacent counter so that the contents of each counter will successively appear on the common bus comprised of the output terminals of the stages of said given counter.

In the drawings:

FIG. 2 is a logic diagram of the system employing two counters each having two stages to illustrate the switching of the counters to devices which transfer their contents to the next adjacent counter; and FIG. 2a is a truth table illustrating operation of counters in FIG. 2.

Figure 1:
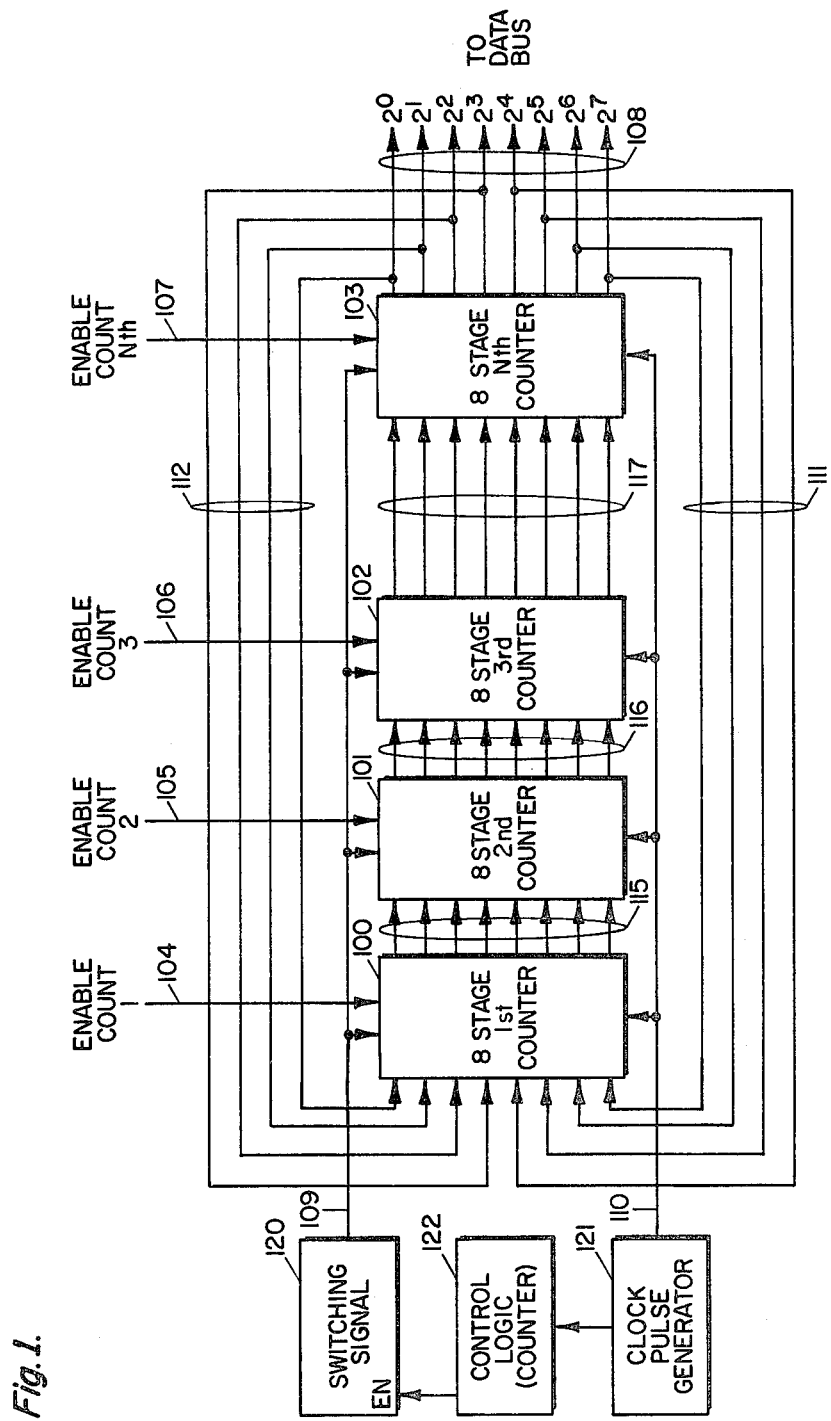
FIG. 1 is a block diagram illustrating the broad architecture of the invention.

Referring now to FIG. 1 there is shown an array of N 8 stage counters, of which only four are actually shown in FIG. 1, and which are identified by reference characters 100, 101, 102 and 103. Each of the counters has an input means for receiving pulses to be counted, and identified by reference characters 104, 105, 106 and 107. Each of the 8 stages of each counter is connected to corresponding stages of the adjacent counter. More specifically, the 8 leads 115, connect the 8 stages of counter 100 to counter 101, the 8 leads 116 connect the 8 stages of counter 101 to counter 102, then 8 leads 117 connect the 8 stages of counter 102 to the next counter in the series and the two groups of 4 leads 111 and 112 connect the 8 stages of the Nth counter 103 back to the 8 stages of the first counter 100.

As will be discussed in the detailed logic diagram of FIG. 2, when a switching signal is supplied on lead 109 followed by clock pulse on lead 110, the contents of each counter will be transferred to its adjacent counter. Thus, the contents of the 8 stages of counter 100 will be transferred to the corresponding 8 stages of counter 101, the contents of the 8 stages of counter 101 will be transferred to the corresponding 8 stages of counter 102 and so on. The contents of the 8 stages of the Nth counter 103 will be transferred to the corresponding 8 stages of the first counter 100. Thus, it can be seen that the plurality of counters are, in fact, arranged in a ring with the Nth counter 103 feeding back to the first counter 100.

Upon the occurrence of a second clock pulse, and in the presence of a switching signal on switching lead 109, the original contents of the first counter, which had been transferred to the second counter 101, will be transferred to the 8 stages of counter 102. Similarly, the occurrence of the second clock pulse will cause the original contents of the Nth counter 103, which had been transferred to the first counter 100, to next be transferred to the second counter 101.

At the end of N clock pulses all of the counters will have again recovered their original count since the contents of each counter will have circulated through each of the entire N counters and back to the original counter.

As the count of each counter entered the Nth counter 103 such counter will also appear on the data bus comprised of the 8 leads 108 and will be supplied to a suitable utilization means such as a data processor. The particular counter whose count is on the data bus 108 at any given time is easily determined by counting the clock pulses supplied from clock pulse generator 110 after the switching signal 109 is supplied to cause the transfers to begin.

Referring now to FIG. 2 there is shown a logic diagram of the system employing two, two stage synchronous counters which will illustrate the details of the invention.

Each of the two counters includes a pair of conventional D-type flip-flops such as flip-flops 201 and 202 to the left of the dashed line 200 which functions to divide the two counters. Each counter also includes a pair of switches or multiplexing devices such as devices 205 and 206, the outputs of which go to the D inputs of the two flip-flops 201 and 202. The devices 205 and 206 each function as a switch to transform the counters into a form of shift register device, wherein the information flows horizontally from the Q output of flip-flop 201 of the first counter to the Q output of flip-flop 203 of the second counter and from flip-flop 202 horizontally to flip-flop 204, with the Q outputs of flip-flops 203 and 204 connected to data bus 220 where it can be utilized by a suitable means such as a microprocessor. The switches 205-208 are operated simultaneously by the output from switching pulse source 121 whose output lead 123 is connected to each of the switching means 205-208. The action of all the switches 205-208 is the same so consider switch 205 as typical. When the output of switching pulse source 121 is low AND gate 226 is disabled and AND gate 225 is enabled. Similarly, in switch 206, the AND gate 261 is disabled and AND gate 260 is enabled. Similar conditions exist in switches 207 and 208 of the second counter.

Under these conditions, the structure to the left of vertical dashed line 200 will function as conventional counter as will the structure to the right of dashed line 200.

Consider specifically the counter to the left of dashed line 200. An input pulse is received from input count source 271 on input 247 of AND gate 245, which has been previously primed by a priming pulse supplied from enable signal source 270 to input lead 246. Assuming that the first counter initially contains a count of zero, the first input count will then supply a 1 to input terminal 240 of Exclusive OR (XOR) gate 209. The Q output of flip-flop 201 will be a 0 since the count in the counter is zero so that XOR gate 209 will supply a 1 to the upper input of AND gate 225 via lead 228. As mentioned above, AND gate 225 has been previously primed by a low output from switching pulse source 121. Therefore, a 1 will be supplied through AND gate 225, OR gate 227, and to the D input of flip-flop 201. When the next clock pulse is supplied to clock input 280 of flip-flop 201 from clock source 120, the signal logic level appearing at input D of flip-flop 201 will be transferred to the Q output thereof. The foregoing function is characteristic of a conventional D type flip-flop.

Thus, flip-flop 201 will have a 1 or high level signal appearing on its Q output terminal, indicating a count of 1 in the counter.

When the next input count input is supplied to input 247 of AND gate 245, it will again be supplied to the upper input 240 of XOR gate 209. However, the Q output of flip-flop 201 now is at a high level so that the output of XOR gate 209 will be a 0, which will be supplied through AND gate 225 and OR gate 227 to the D input of flip-flop 201 via lead 232. As discussed above, there is no output from AND gate 226 since switching pulse source 121 is outputting a low level signal. The 1 supplied from AND gate 245 is also supplied to one input of AND gate 250 which is primed by the 1 being supplied to the other input thereof from the Q output of flip-flop 201. Thus, AND gate 250 supplies a 1 to the upper input of XOR gate 201. Since a 0 is supplied to the lower output of XOR gate 210 from the Q output of flip-flop 202 the said XOR gate 201 will supply a 1 to the upper terminal of AND gate 260 which has been primed by the output of switching pulse source 121. Thus a 1 is supplied from AND gate 260 through OR gate 281 to the D input of flip-flop 202.

Upon the occurrence of the next clock pulse, two changes will occur. First, the 1 appearing on the input of the D input of flip-flop 202 will be transferred to the Q output indicating a count of 2 in the second stage of the counter. Secondly, the 0 supplied to the D input of flip-flop 201 will be transferred to the Q output thereof, indicating that the flip-flop 201, which is the first stage of the counter, contains a 0. Thus, the total count of a counter is now 2, which is of course, the number of input counts supplied to input AND gate 245.

A third input count supplied to input 247 of AND gate 245 will generate a 1 at the output XOR gate 209 to thereby enter a 1 into flip-flop 201 upon the occurrence of the third clock pulse. However, the count input supplied to AND gate 250 will not pass therethrough since the Q input of flip-flop 201 is a 0. Thus the contents of flip-flop 202 will remain a binary 1 so that the total count in the counter will now be a binary 3 with each of the flip-flops 201 and 202 containing a 1 which appears at the Q outputs of flip-flops 201 and 202.

The second counter at the right of the dashed line 200 functions in precisely the same manner as does the first counter to the left of dashed line 200. The AND gates 285 and 286 and the XOR gates 211 and 212 of the second counter correspond to AND gates 245 and 250 and XOR gates 209 an 210 of the first counter. In FIG. 2a, there is shown a truth table of the operation of the counters with alternate inputs of clock pulses and input counts.

Consider now the case where it is desired to transfer the contents of each stage of the first counter to the corresponding stages of the second counter and specifically the contents of flip-flop 201 to flip-flop 203 and the contents of flip-flop 202 to flip-flop 204.

The switching pulse source 121 is activated by control logic means 122 to assume its high level, thereby inhibiting AND gates 225 and 260 of counter 1 and AND gates 290 and 308 of the second counter. Simultaneously, AND gates 226, 261, 291 and 300 of the four switches 205-208 will be energized by the high level output from switching signal source 121.

It will be evident that any input counts supplied to either the first or second counter will be blocked from appearing at the D input of any of the flip-flops thereof because of the disabling of AND gates 225, 260, 290 and 308 of the four switches 205-208. However, the Q outputs of each of the four flip-flops are now connected to the D inputs of the corresponding stages of the next adjacent counter. Specifically, the Q output of flip-flop 201 is connected through lead 296, primed AND gate 291 and OR gate 298 to the D input of flip-flop 203. Similarly, the Q output of flip-flop 202 is connected through primed AND gate 300, OR gate 301, to the D input of flip-flop 204. Further, the Q inputs of the two flip-flops 203 and 204 are connected back through leads 303 and 304 and primed AND gates 226 and 261 to the D inputs of flip-flops 201 and 202 of the first counter. Thus a ring of counters is formed whereby the counts of each counter are supplied to the inputs of the next counter. In FIG. 2a, there is shown a truth table of the operation of the counters with alternate inputs of clock pulses and input counts.

The transfer of the count of one counter to its adjacent counter occurs upon the occurrence of a clock pulse supplied from clock source 120 simultaneously to the clock inputs of each of the flip-flops 201, 202, 203 and 204, at which time the signal logic level appearing on the D input of that particular flip-flop is transferred to the Q output of that flip-flop. Now since the signal appearing on the D input of flip-flop 203, for example, is in fact, the signal logic level appearing on the Q output of the flip-flop 201 of the previous counter, the result will be that the signal level appearing on the Q output of flip-flop 201 will be transferred to the Q output of flip-flop 203.

Similarly, the signal level appearing on the Q output of flip-flop 202 will be transferred to the Q output of flip-flop 204. Further, the signal outputs appearing on the Q outputs of flip-flops 203 and 204, will be transferred back through leads 303 and 304 to the AND gate 226 and 261 and then to the Q outputs of flip-flops 201 and 202.

Such shifting of the counts of the various counters through the ring of counters will continue indefinitely as long as clock pulse are supplied while the switching pulse source 123 is at its high level. The system is equally applicable to a much larger number of counters and the two counters can have many more stages. For example, assuming there were 16 counters each having 8 stages, it is possible with this system to transfer the count of each of the 16 counters through all the other 15 counters and then back to the original counter so that each counter ends up containing the same count with which it started. This can be accomplished by applying 16 clock pulses to the system while the switching pulse source 121 is at its high level. Control logic 122 is employed to control the duration of the switching pulse source 121 in terms of clock signals supplied from clock source 120. It is apparent that the leading and trailing edges of the switching signal must occur between clock pulses to avoid a race condition. Similarly, in the operation of the counter, the clock pulses and the input counts must occur alternately.

What is claimed is:

1. A system for reading out the contents of multiple counters onto the leads of a common bus comprising:
   a plurality of first to Mth synchronous binary counters with each counter having N corresponding stages, each having an output terminal on which appears the contents of said stage, an input terminal, and a clock pulse input terminal, with each stage responsive to a clock pulse supplied to its clock pulse input terminal to transfer the signal logic level on its input terminal to its output terminal and with the output terminals of the corresponding stages of Mth counter comprising said common bus;
   clock pulse generating means for supplying clock pulses simultaneously to all of said clock input terminals;
   means for generating a switching pulse;
   switching means responsive to said switching pulse for connecting said output terminal of each stage simultaneously and in parallel to the input terminal of the corresponding stage of the next adjacent counter in said ring of counters and including the connections of the output terminals of the corresponding stages of the Mth binary counter to the input terminals of the corresponding stages of said first synchronous binary counter.

2. A system for successively reading out in parallel manner the contents of multiple counters onto a common multiplexed bus comprising:
   a plurality of M synchronous binary counters arranged generally in a row and each having N corresponding stages with each stage having an output terminal on which appears the contents of said stage, an input terminal, and a clock pulse input terminal, with each stage responsive to a clock pulse of repetition rate R supplied to its clock input terminal to transfer the signal logic level on its input terminal to its output terminal, and with the output terminals of the stages of the Mth counter in the row of counters each comprising said one of the leads of the common multiple lead bus;
   signal generating means for generating and supplying N clock pulses to all of said clock pulse input terminals and for generating a switching signal having a duration which can equal N clock pulses; and
   switching means responsive to said switching signal for the duration of said switching signal to connect said output terminal of each stage to the input terminal of the corresponding stage of the next adjacent counter in said row of counters.

3. A system for reading out the contents of corresponding stages of multiple counters each onto a separate lead of a common data bus and comprising:
   a plurality of storage elements arranged in a matrix of rows and columns of storage elements with each storage element having an input terminal, an output terminal, and a clock input terminal and responsive to a clock pulse supplied to its clock input terminal to transfer the signal on its input terminal to its output terminal;
   a plurality of first logic means each interconnecting a column of storage elements to form a counter with each storage element having a second input terminal responsive to an input pulse supplied thereto followed by a clock pulse supplied to the clock input terminals of said column of storage elements to advance the count in said counter;
   a common data bus having a separate lead connected to each output terminal of the storage elements of a given counter;
   means for generating a switching signal; and
   switching means responsive to said switching signal to connect the output terminals of all of the storage elements in each counter to the input terminals of the corresponding adjacent storage elements in the same row of storage elements to form a plurality of rows of shift registers.

4. A system for successively shifting the contents of each stage of a counter in a ring of counters into the corresponding stage of the adjacent counter and comprising:
   a plurality of M synchronous binary counters arranged in a ring with each counter having N corresponding stages each having an output terminal on which appears the contents of said stage, an input terminal, and a clock pulse input terminal, with each stage responsive to a clock pulse supplied to its clock input terminal to transfer the signal logic level on its input terminal to its output terminal, and with switching means for connecting the output terminal of each stage of each counter to the corresponding input of the adjacent counter;
   signal generating means for generating and supplying clock pulses to all of said clock input terminals and for generating a switching signal having a duration equal to M clock pulses or less; and
   switching means responsive to said switching signal to connect said output terminal of each stage of each counter to the input terminal of the corresponding stage of the next adjacent counter in said ring of counters.

* * * * *